(12) United States Patent
Mizuno

(10) Patent No.: US 6,563,849 B2
(45) Date of Patent: May 13, 2003

(54) DRIVE CIRCUIT FOR LIGHT EMITTING DEVICE

(75) Inventor: Seiichiro Mizuno, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 0 days.

(21) Appl. No.: 09/907,438

(22) Filed: Jul. 18, 2001

(65) Prior Publication Data
US 2002/0048298 A1 Apr. 25, 2002

(30) Foreign Application Priority Data
Jul. 19, 2000 (JP) .................................. 2000-219777

(51) Int. Cl.⁷ .............................................. H01S 3/00
(52) U.S. Cl. ............... 372/38.02; 372/38.1; 372/38.07; 315/200 A; 315/241 S; 315/241 P
(58) Field of Search .................... 372/380.02

(56) References Cited

U.S. PATENT DOCUMENTS
5,898,334 A    4/1999  Fairgrieve ................ 37/411

FOREIGN PATENT DOCUMENTS
JP     63-251945    10/1988

*Primary Examiner*—Paul Ip
*Assistant Examiner*—Armando Rodriguez
(74) *Attorney, Agent, or Firm*—Morgan, Lewis & Bockius LLP

(57) ABSTRACT

A drive circuit is provided with a source follower circuit 2 consisting of an NMOS-FET connected to the anode side of light emitting device 1 and adapted to directly drive the light emitting device 1, a source follower circuit 3 consisting of a PMOS-FET a gate terminal of which is connected to a source terminal of the source follower circuit 2 consisting of the NMOS-FET, and a PMOS-FET 4 adapted to supply an electric current to the source follower circuit 3 consisting of the PMOS-FET.

4 Claims, 7 Drawing Sheets

DRIVE CIRCUIT FOR LIGHT EMITTING DEVICE

BACKGROUND OF THE INVENTION

1. Field of the Invention

The present invention relates to a drive circuit for a light emitting device.

2. Related Background Art

A conventional drive circuit for driving a laser diode as a light emitting device was constructed in the structure as shown in FIG. 4. Specifically, the drain terminal of PMOS-FET 41 is connected to the anode side of laser diode 40 with the cathode grounded, to drive the laser diode 40 directly. In the case of CD-R/W, DVD, etc., however, the laser diode 40 and driving IC (PMOS-FET 41 in this case) are spaced several cm or more apart from each other. In this configuration, a line 42 connects the laser diode 40 to the PMOS-FET 41. Since this line 42 definitely produces an inductance component, peaking and ringing occur because of resonance, which was a serious problem in use of products.

FIG. 5 is a drawing to show the simulation result of the conventional drive circuit for driving the light emitting device. FIG. 5 shows occurrence of heavy peaking and ringing due to resonance as described above. Efforts have been made heretofore to use wiring materials resisting the resonance, and research has been conducted on a method of interposing a resistor R and a capacitor C in series between bonding pad 43 and the ground shown in FIG. 4.

SUMMARY OF THE INVENTION

However, extra cost for the wiring materials makes it difficult to decrease the product cost. The method of interposing the resistor R and capacitor C was not a desirable method in view of yield and dispersion, either.

FIG. 6 is a diagram showing an example of a drive circuit for a laser diode by means of a PMOS-FET, and FIG. 7 a diagram showing an equivalent circuit of the drive circuit shown in FIG. 6. The result of theoretical computation of resonance constant Q in this circuit will be presented below. In the discussion hereinafter, $g_{m1}$ and $g_{m2}$ represent mutual conductances, $g_{d1}$ a drain conductance, L an inductance, and C capacitances.

$$g_{m1}V_{gs1} + V_1(sC_1 + gd_1) + \frac{(V_1 - V_{out})}{sL} = 0 \quad (1)$$

$$\frac{(V_{out} - V_1)}{sL} + V_{out}(gm_2 + sC_{out}) = 0 \quad (2)$$

From Eq (2), we can derive $V_1$ as follows.

$$\frac{(V_{out} - V_1)}{sL} = -V_{out}(gm_2 + sC_{out}) \quad (3)$$

$$V_{out} = -V_{out}\, sL(g_{m2} + sC_{out}) + V_1 \quad (4)$$

$$V_1 = V_{out}\{1 + sL(g_{m2} + sC_{out})\} \quad (2)'$$

By substituting (2)' into (1), we can modify Eq (1) as follows.

$$g_{m1}V_{in} + V_1\left(sC_1 + gd_1 + \frac{1}{sL}\right) - \frac{V_{out}}{sL} = 0 \quad (5)$$

$$g_{m1}V_{in} + V_{out}\{1 + sL(g_{m2} + sC_{out})\}\left(sC_1 + gd_1 + \frac{1}{sL}\right) - \frac{V_{out}}{sL} = 0 \quad (6)$$

$$V_{out}\left[\{1 + sL(g_{m2} + sC_{out})\}\left(sC_1 + gd_1 + \frac{1}{sL}\right) - \frac{1}{sL}\right] = -g_{m1}V_{in} \quad (7)$$

Then we obtain $V_{out}/V_{in}$ as follows.

$$\frac{V_{out}}{V_{in}} = \frac{-g_{m1}}{\{1 + sL(g_{m2} + sC_{out})\}\left(sC_1 + gd_1 + \frac{1}{sL}\right)} \quad (8)$$

$$= \frac{-g_{m1}}{sC_1 + gd_1 + (g_{m2} + sC_{out})(s^2LC_1 + sLgd_1 + 1)}$$

Assuming $g_{m2}$ (=200 mS) >> $sC_{out}$ (=5 mS), we obtain the following.

$$\frac{V_{out}}{V_{in}} = \frac{-g_{m1}}{sC_1 + gd_1 + s^2LC_1g_{m2} + sLgd_1g_{m2} + g_{m2}} \quad (9)$$

$$= \frac{-g_{m1}/LC_1g_{m2}}{s^2 + s\left(\frac{1}{Lg_{m2}} + \frac{gd_1}{C_1}\right) + \frac{gd_1}{LC_1g_{m2}} + \frac{1}{LC_1}}$$

From this, s, $\omega_0$, and Q are derived as follows.

$$s = \frac{-\left(\frac{1}{Lg_{m2}} + \frac{gd_1}{C_1}\right) \pm \sqrt{\left(\frac{1}{Lg_{m2}} + \frac{gd_1}{C_1}\right)^2 - 4\left(\frac{gd_1}{LC_1g_{m2}} + \frac{1}{LC_1}\right)}}{2} \quad (10)$$

$$w_0 = \sqrt{\frac{gd_1}{LC_1g_{m2}} + \frac{1}{LC_1}} \quad (11)$$

$$= \sqrt{\frac{gd_1 + g_{m2}}{LC_1g_{m2}}} \approx \frac{1}{\sqrt{LC_1}}$$

$$Q = \frac{w_0}{\frac{1}{Lg_{m2}} + \frac{gd_1}{C_1}} \geq 10 \quad (12)$$

When specific parameters are substituted into the result of inequality (12), the Q factor becomes approximately 10. With the Q factor larger than 1 as in this case, there will occur peaking and ringing as shown in FIG. 5. It is seen from the above result that it is important to set the resonance constant Q at a possible minimum value in order to restrain the peaking and ringing. For suppressing the influence of the inductance L as much as possible to control the value of resonance constant Q to near 1, it is common practice to interpose a resistor in series with L. For example, since a source follower circuit permits an is equivalent resistance to be freely controlled by electric current values, the source follower circuit is also interposed instead of the resistor in certain cases. Let us investigate a configuration incorporating the source follower circuit instead of the resistor.

FIG. 8 is a diagram showing an example of the drive circuit for the laser diode by means of a simple source follower circuit, and FIG. 9 a diagram showing an equivalent circuit of FIG. 8. The result of theoretical computation of resonance constant Q in this circuit will be provided below. In the discussion hereinafter, $g_{m1}$ and $g_{m2}$ represent the mutual conductances, $gd_1$ the drain conductance, L the inductance, and C the capacitances.

$$-V_{gs1}g_{m1} + V_1(gd_1 + sC_1) + \frac{(V_1 - V_{out})}{sL} = 0 \quad (13)$$

$$\frac{(V_{out} - V_1)}{sL} + V_{out}(g_{m2} + sC_{out}) = 0 \quad (14)$$

Using the relation of $V_{gs1}=V_{in}-V_{out}$, Eq (13) can be rewritten as follows.

$$-(V_{in} - V_{out})g_{m1} + V_1(gd_1 + sC_1) + \frac{(V_1 - V_{out})}{sL} = 0, \quad (13)'$$

For Eq (14), since $s_{COUT} \approx 30$ mS at $g_{m2} \approx 200$ mS and f=1 GHz, we can assume $g_{m2} >> sC_{out}$.

$$\frac{(V_{out} - V_1)}{sL} + V_{out}g_{m2} = 0 \quad (15)$$

$$\left(\frac{1}{sL} + g_{m2}\right)V_{out} = \frac{V_1}{sL} \quad (16)$$

$$V_1 = sL\left(\frac{1}{sL} + g_{m2}\right)V_{out} = (1 + sLg_{m2})V_{out}, \quad (14)'$$

By substituting Eq (14)' into Eq (13)', we obtain the following relation.

$$-(V_{in} - V_{out})g_{m1} + \quad (17)$$
$$V_{out}(1 + sLg_{m2})(gd_1 + sC_1) + \frac{(1 + sLg_{m2})V_{out} - V_{out}}{sL} = 0$$

$$-V_{in}g_{m1} + g_{m1}V_{out} + V_{out}(1 + sLg_{m2})(gd_1 + sC_1) + g_{m2}V_{out} = 0 \quad (18)$$

Accordingly, $V_{out}/V_{in}$ can be derived as follows.

$$\frac{V_{out}}{V_{in}} = \frac{g_{m1}}{g_{m1} + (1 + sLg_{m2})(gd_1 + sC_1) + g_{m2}} \quad (19)$$

$$= \frac{g_{m1}}{s^2 Lg_{m2}C_1 + s(Lg_{m2}gd_1 + C_1) + (gd_1 + g_{m1} + g_{m2})}$$

$$\approx \frac{g_{m1}/Lg_{m2}C_1}{s^2 + s\left(\frac{gd_1}{C_1} + \frac{1}{Lg_{m2}}\right) + \frac{1}{LC_1} + \frac{g_{m1}}{Lg_{m2}C_1}}$$

From this, s, $\omega_0$, and Q are obtained as follows.

$$s = \frac{-\left(\frac{gd_1}{C_1} + \frac{1}{Lg_{m2}}\right) \pm \sqrt{\left(\frac{gd_1}{C_1} + \frac{1}{Lg_{m2}}\right)^2 - 4\left(\frac{1}{LC_1} + \frac{g_{m1}}{Lg_{m2}C_1} + \right)}}{2} \quad (20)$$

$$w_0 = \sqrt{\frac{1}{LC_1} + \frac{g_{m1}}{Lg_{m2}C_1}} \quad (21)$$

$$Q = \frac{w_0}{\frac{gd_1}{C_1} + \frac{1}{Lg_{m2}}} \quad (22)$$

From the above computation result, the resonance frequency $\omega_0$ increased a little, but Q itself was not affected at all. Namely, it was found that the resonance constant Q itself did not vary depending upon whether the current source was the common source of PMOS-FET or the common drain circuit of NMOS-FET, and that there was little effect thereby. Since the value of Q itself was unable to be suppressed even by the attempt to control the influence of L by the method of simply interposing the resistor R as described above, it was difficult to restrain the ringing and peaking. Since the number of portions requiring supply of electric current increased in order to solve these issues, it was also difficult to drive the circuit by the low supply voltage of 3.3 V or the like.

U.S. Pat. No. 5,898,334 discloses a method of lowering the parasitic capacitance by means of a single drive source, but this method involves such requirements that the size of MQ1 has to be small and the gate voltage has to be large. For this reason, it is necessary to use the voltage of 5 V or more, which makes driving at a low supply voltage difficult and poses the problem of heat generation.

The present invention has been accomplished under such circumstances and an object of the invention is to provide a drive circuit for a light emitting device that permits the driving at a low supply voltage, without occurrence of the ringing and peaking and with little influence of yield and dispersion.

A drive circuit according to the present invention is a drive circuit for driving a light emitting device, which comprises a first source follower circuit comprising an NMOS-FET having a gate terminal and adapted to supply a drive current to the light emitting device according to an input voltage into the said gate terminal; a second source follower circuit comprising a first PMOS-FET having a gate terminal connected to a node downstream of the first source follower circuit; and a second PMOS-FET having a gate terminal and adapted to supply an electric current to the second source follower circuit according to an input voltage into the said gate terminal, wherein a potential between the first PMOS-FET and the second PMOS-FET is supplied as the input voltage to the gate terminal of the NMOS-FET.

In this case, a voltage Vgs between the gate terminal of the NMOS-FET of the first source follower circuit and the source terminal located downstream thereof is proportional to a voltage Vgs between the gate terminal and source terminal of the first PMOS-FET having the gate terminal connected to the node downstream of the first source follower circuit. Therefore, while an electric current flowing in each MOS-FET is determined according to the voltage Vgs between the gate terminal and source terminal, the electric current flowing in the first PMOS-FET is in a proportional relation to the electric current flowing in the NMOS-FET. On the other hand, the electric current flowing in the first PMOS-FET is determined according to the input voltage into the gate terminal of the second PMOS-FET. Accordingly, the electric currents flowing in the first PMOS-FET and the NMOS-FET become constant if a fixed voltage is applied to the gate terminal of the second PMOS-FET.

The potential at the node between the downstream side of the NMOS-FET of the first source follower circuit and the light emitting device can vary depending upon states of the light emitting device and peripheral circuits, but even with such variation the electric current flowing in the NMOS-FET rarely varies as long as the electric current flowing in the first PMOS-FET is kept constant. Since the Q factor of the circuit varies depending upon the electric current flowing in the NMOS-FET, if the constants of the circuit components are selected so as to make the Q factor low, use of the drive circuit of the present configuration makes it feasible to maintain the Q factor at a low level.

Since the resonance constant Q can be made small in the present drive circuit as described above, it becomes feasible to suppress the ringing and peaking and drive the light emitting device on a stable basis. Since the number of components can be reduced, it is feasible to reduce the influence of yield and dispersion and reduce the cost. Since the impedance is low, the gate voltage can also be set low, thus enabling the driving at the low supply voltage. Further, since there arises no problem even with some parasitic capacitance, there is no need for employing the configuration for lowering the parasitic capacitance as before.

In the drive circuit for the light emitting device, it is preferable to gradually apply the electric current to the light emitting device, for example, in a stepped pattern of about four steps, instead of increasing the electric current directly to a high level.

Then the drive circuit for the light emitting device is characterized by comprising a PMOS-FET group for further supplying a drive current to the light emitting device through the node downstream of the first source follower circuit. Namely, when the drive current is supplied from the PMOS-FET group to the light emitting device, the total of the drive current supplied to the light emitting device can be increased.

When the drive current is supplied to the light emitting device, for example, by four steps in this configuration, the drive current of the first step is given by use of the first and second source follower circuits and the second PMOS-FET, whereby it becomes feasible to make the resonance constant Q small, suppress the ringing and peaking, and implement the stable driving of the light emitting device. In this case, drive current increases of the rest three steps can be implemented by sequentially activating the PMOS-FET group. Since the present configuration obviates the need for using the aforementioned Q-factor variation limiting structure in the PMOS-FET group, it is feasible to decrease the number of components, reduce the influence of yield and product dispersion, and decrease the cost.

Since the impedance is low, the gate voltage can be set low, thus enabling the driving at the low supply voltage. Further, since there arises no problem even with some parasitic capacitance, there is no need for employing the configuration of lowering the parasitic capacitance as before.

In the present drive circuit for the light emitting, the mutual conductance of the first source follower circuit comprising the NMOS-FET has either value in a range of 10 mS (millisiemens) to 100 mS.

Since the mutual conductance of the source follower circuit comprising the NMOS-FET has either value in the range of 10 mS to 100 mS, the resonance constant Q can be made small.

A light emitting apparatus according to the present invention comprises a light emitting device and the drive circuit for the light emitting device in either of the configurations as described above.

This configuration makes it feasible to suppress the ringing and peaking and implement stable light emission. Since the number of components can be reduced, it becomes feasible to reduce the influence of yield and dispersion and decrease the cost. Since the impedance is low, the gate voltage can be set low, thus enabling the driving at the low supply voltage.

DESCRIPTION OF THE PREFERRED EMBODIMENTS

Figure 1A:
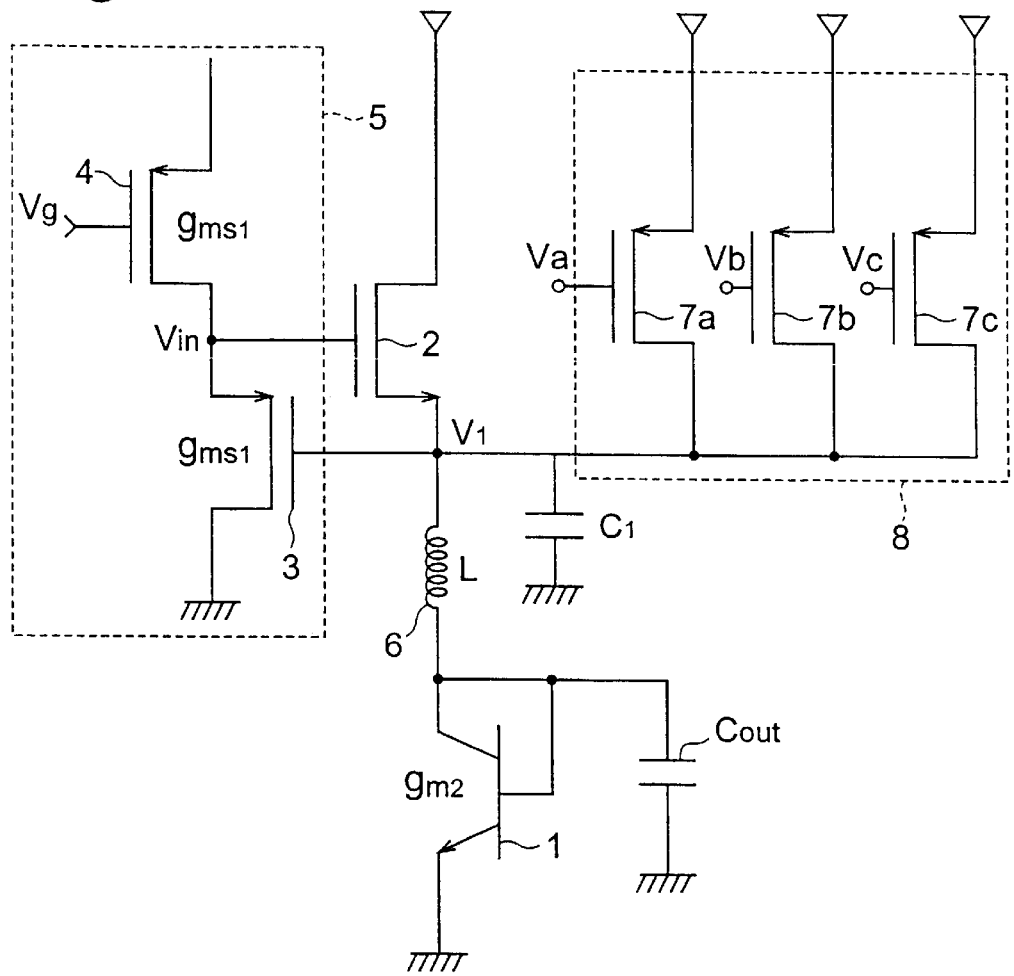
FIG. 1A is a diagram showing a configuration of a drive circuit for a light emitting device according to an embodiment.
Figure 1B:
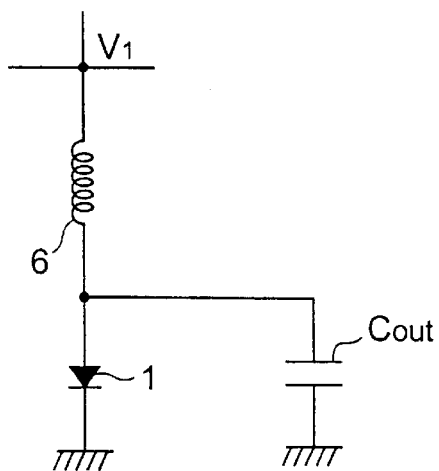
FIG. 1B is a circuit diagram of the part around the laser diode.

FIG. 1A is a diagram showing a configuration of the drive circuit for the light emitting device, in which the laser diode (light emitting device) 1 is illustrated as a bipolar transistor. FIG. 1B is a circuit diagram of the part around the laser diode 1. Namely, the laser diode 1 is illustrated as a transistor with the collector and base thereof short-circuited for convenience' sake of description in FIG. 1A, but the laser diode 1 is one to be indicated by the symbol shown in FIG. 1B as a matter of fact.

The laser diode 1 is grounded on the cathode side and a source terminal of source follower circuit 2 consisting of an NMOS-FET (field effect transistor) is connected to the anode side of the laser diode 1. A gate terminal of source follower circuit 3 consisting of a PMOS-FET (field effect transistor) is connected to the source terminal of the source follower circuit 2 consisting of the NMOS-FET. A PMOS-FET 4 is connected to a source terminal of the source follower circuit 3 consisting of the PMOS-FET to supply power to the source follower circuit 3 consisting of the PMOS-FET. The source follower circuit 3 of the PMOS-FET, and the PMOS-FET 4 constitute a source follower part 5 as a feedback circuit.

A line 6 having an inductance L connects the laser diode 1 and the source follower circuit 2 consisting of the NMOS-FET to each other. Since the operation of the laser diode 1 as an electric circuit can be handled approximately as a transistor, it is assumed to be a transistor, and a capacitor $C_{out}$ is connected to the emitter and collector of this transistor. Three PMOS-FETs 7a, 7b, 7c for driving the laser diode 1 are connected in parallel to the source terminal of the source follower circuit 2 consisting of the NMOS-FET, and constitute a PMOS-FET circuit 8.

A capacitor $C_1$ grounded at one end is connected to between the source terminal of the source follower circuit 2 consisting of the NMOS-FET, and the PMOS-FET circuit 8. The source of each of the PMOS-FETs 4, 7a, 7b, 7c and the drain of NMOS-FET 2 are connected to a power-supply potential.

Figure 2:
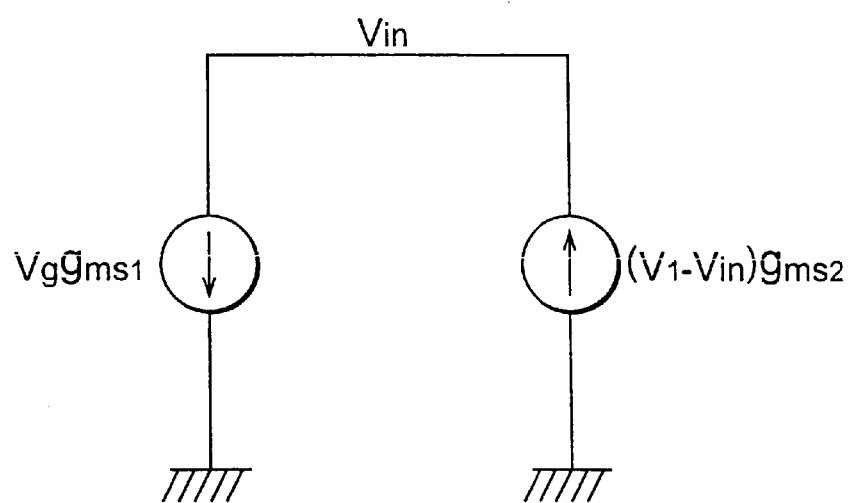
FIG. 2 is a diagram showing an equivalent circuit of the source follower circuit part.

FIG. 2 is a diagram showing an equivalent circuit of the source follower part 5. The result of theoretical computation of the resonance constant Q in this circuit will be presented below. In the discussion hereinafter, $g_{ms1}$ and $g_{ms2}$ represent the mutual conductances, $gd_1$ the drain conductance, L the inductance, and C the capacitances.

$$-V_{gs1}g_{m1} + V_1(gd_1 + sC_1) + \frac{(V_1 - V_{out})}{sL} = 0 \quad (23)$$

$$\frac{(V_{out} - V_1)}{sL} + V_{out}(g_{m2} + sC_{out}) = 0 \quad (24)$$

Using the relation of $V_{gs1} = V_{in} - V_{out}$, Eq (23) can be rewritten as follows.

$$-(V_{in} - V_{out})g_{m1} + V_1(gd_1 + sC_1) + \frac{(V_1 - V_{out})}{sL} = 0 \quad (25)$$

Further, the following relation holds.

$$V_{in} = V_1 - \frac{g_{ms1}}{g_{ms2}} V_g \quad (26)$$

From the above equations, we can obtain the following relation.

$$-\left(V_1 - \frac{g_{ms1}}{g_{ms2}} V_g - V_{out}\right)g_{m1} + V_1(gd_1 + sC_1) + \frac{(V_1 - V_{out})}{sL} = 0, \quad (23)'$$

Concerning Eq (23), the mutual conductance $g_{m1}$ of the source follower circuit 2 consisting of the NMOS-FET has either value in the range of 10 mS to 100 mS. This can make the resonance constant Q small. Concerning Eq (24), supposing $g_{ms}$ is approximately 200 mS and f=1 GHz, $sC_{out}$ is approximately 30 mS and thus we can assume $g_{m2} \gg sC_{out}$.

$$\frac{(V_{out} - V_1)}{sL} + V_{out}g_{m2} = 0 \quad (27)$$

$$V_{out} - V_1 = -sLV_{out}g_{m2} \quad (28)$$

$$V_1 = V_{out}(1 + sLg_{m2}), \quad (24)'$$

By substituting (24)' into (23)' and arranging it, we obtain the following relation.

$$\frac{g_{ms1}}{g_{ms2}}g_{m1}V_g = V_{out}\{sLg_{m1}g_{m2} + (1 + sLg_{m2})(gd_1 + sC_1) + g_{m2}\} \quad (29)$$

Since $g_{m2}$ is approximately 200 mS and $gd_1$ is 1 mS, $g_{m2} \gg gd_1$ and thus $V_{out}/V_{in}$ becomes as follows.

$$\frac{V_{out}}{V_{in}} = \frac{g_{m1}\frac{g_{ms1}}{g_{ms2}}}{sLg_{m1}g_{m2} + s^2 L g_{m2} C_1 + sLgd_1 g_{m2} + sC_1 + gd_1 + g_{m2}}$$

$$= \frac{g_{m1}\frac{g_{ms1}}{g_{ms2}}}{s^2 L g_{m2} C_1 + s(Lg_{m1}g_{m2} + Lgd_1 g_{m2} + C_1) + gd_1 + g_{m2}}$$

$$= \frac{g_{m1}g_{ms1}/Lg_{m2}C_1 g_{ms2}}{s^2 + s\left(\frac{g_{m1}}{C_1} + \frac{gd_1}{C_1} + \frac{1}{Lg_{m2}}\right) + \frac{1}{LC_1}} \quad (30)$$

From the above, $\omega_0$ and Q are obtained as follows.

$$w_0 = \frac{1}{\sqrt{LC_1}} \approx 7G \quad (31)$$

$$Q = \frac{w_0}{\frac{g_{m1}}{C_1} + \frac{gd_1}{C_1} + \frac{1}{Lg_{m2}}} \approx 0.445 \quad (32)$$

Supposing $f_0$=1.12 GHz, $\omega_0$ is ca. 7 G, $g_{m1}/C_1$ ca. 14.7 G, $gd_1/C_1$ ca. 0.5 G, and $1/Lg_{m2}$ ca. 0.5 G. Thus the value of Q becomes ca. 0.445. It is seen from this result that the impedance of the source follower circuit eventually has the effect of decreasing the resonance constant Q because of the effect of the feedback loop. Namely, since the denominator of the resonance constant Q includes the impedance component of the source follower circuit, it acts to decrease Q.

The present drive circuit for the light emitting device comprises the first source follower circuit 2 comprising the NMOS-FET (2) having the gate terminal and adapted to supply the drive current to the light emitting device 1 according to the input voltage into the gate terminal, the second source follower circuit 3 comprising the first PMOS-FET (3) having the gate terminal connected to the node (V1) downstream of the first source follower circuit 2, and the second PMOS-FET 4 having the gate terminal and adapted to supply the electric current to the second source follower circuit 3 according to the input voltage into the gate terminal, and is characterized in that the potential between the first PMOS-FET 3 and the second PMOS-FET 4 is supplied as the input voltage to the gate terminal of the NMOS-FET (2).

The voltage Vgs between the gate terminal of the NMOS-FET (2) of the first source follower circuit 2 and the source terminal located downstream thereof is proportional to the voltage Vgs between the gate terminal and source terminal of the first PMOS-FET (3) having the gate terminal connected to the node (V1) downstream of the first source follower circuit 2. Therefore, while an electric current flowing in each MOS-FET is determined according to the voltage Vgs between the gate terminal and source terminal, the electric current flowing in the first PMOS-FET (3) is in a proportional relation to the electric current flowing in the NMOS-FET (2).

On the other hand, the electric current flowing in the first PMOS-FET (3) is determined according to the input voltage into the gate terminal of the second PMOS-FET (4). Therefore, when the constant voltage is applied to the gate terminal of the second PMOS-FET (4), the electric currents flowing in the first PMOS-FET (3) and in the NMOS-FET (2) become constant.

The potential at the node (V1) between the downstream side of the NMOS-FET (2) of the first source follower circuit and the laser diode 1 can vary depending upon states of the laser diode 1 and peripheral circuits, but even with such variation the electric current flowing in the NMOS-FET (2) rarely varies as long as the electric current flowing in the first PMOS-FET (3) is kept constant. Since the Q factor of the circuit varies depending upon the electric current flowing in the NMOS-FET (2), if the constants of the circuit components are selected so as to make the Q factor low, the Q factor can be maintained at a low level by use of the drive circuit of the present configuration.

Since in the present embodiment the resonance constant Q can be made small as described above, it becomes feasible to suppress the ringing and peaking and implement the stable driving of the light emitting device. Since the number of components can be decreased, it is feasible to reduce the influence of yield and product dispersion and decrease the cost.

Since the impedance can be controlled to a low level, the gate voltage can be set low, thus enabling the driving at the low supply voltage. Further, since there arises no problem with some parasitic capacitance, there is no need for employing the configuration of lowering the parasitic capacitance as before.

In the case of the drive circuit for the light emitting device as shown in FIGS. 1A and 1B, it is common practice to gradually apply the electric current to the laser diode 1, for example, in a stepped pattern of about four steps, instead of increasing the electric current directly to a high level. In the present embodiment, the source follower part 5 supplies the electric current of only the first step out of the four steps to the laser diode 1 by the feedback loop, and step-ups of the remaining three steps are implemented by the PMOS-FET circuit 8 comprised of a plurality of PMOS-FETs. The reason is that once the impedance level is fixed in a low state at the first stage of the initial lowest current, there is no need to decrease the impedance further.

Namely, the electric current of the first step is first flowed by supplying the dc voltage Vg to the gate terminal of the first-stage PMOS-FET (4) and, subsequent thereto, the voltages Va, Vb, and Vc are sequentially supplied to the gates of the PMOS-FETs 7a, 7b, and 7c, respectively, constituting the PMOS-FET circuit 8. A large drive current can be supplied to the laser diode 1 by properly timing voltage pulses into the gate terminals of these PMOS-FETs 4, 7a, 7b, 7c to each other. Namely, the magnitude of the drive current supplied to the laser diode 1 is dependent upon the number of simultaneous pulses and the maximum drive current is supplied to the laser diode 1 when all pulses are at the same time.

In order to realize the four steps in this configuration, the resonance constant Q can be made small by provision of the feedback circuit only in the part of the first step, which makes it feasible to suppress the ringing and peaking and implement the stable driving of the light emitting device.

In this configuration, the remaining three steps are implemented by the driving with the PMOS-FET group 8 as before, which makes it feasible to decrease the number of components, reduce the influence of yield and product dispersion, and decrease the cost. Since the impedance can be controlled at a low level, the gate voltage can be set low, thus enabling the driving at the low supply voltage. The drive circuit for the light emitting device according to the present embodiment enables the laser diode 1 to be driven at the gate voltage of not more than 3.3 V. A plurality of laser diodes 1 can be disposed in the circuitry, and they can be connected in parallel.

Figure 3A:
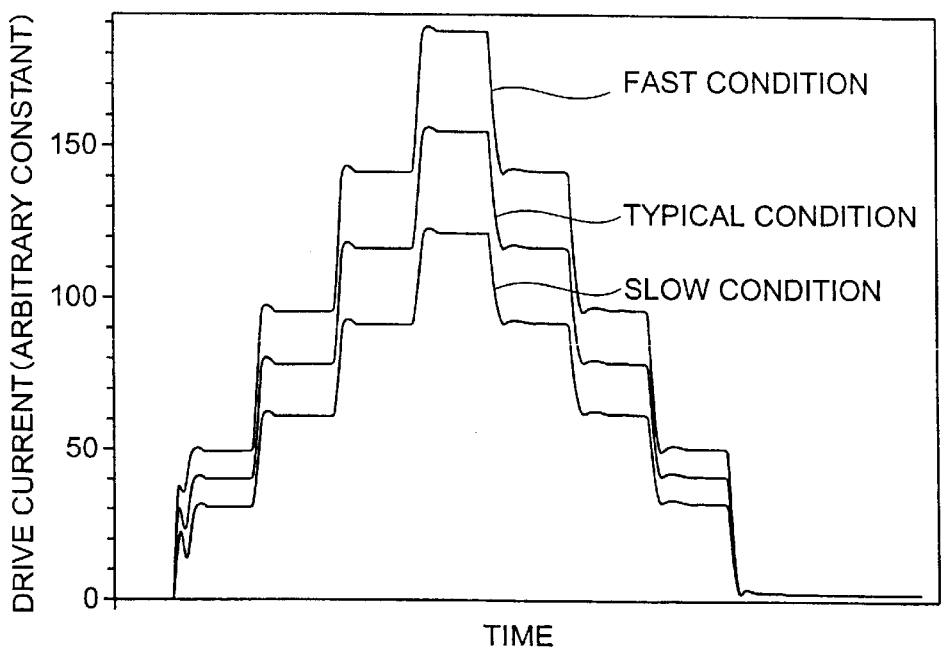
FIG. 3A is a graph (simulation) showing time dependence of drive current in the drive circuit for the light emitting device according to the embodiment.
Figure 3B:
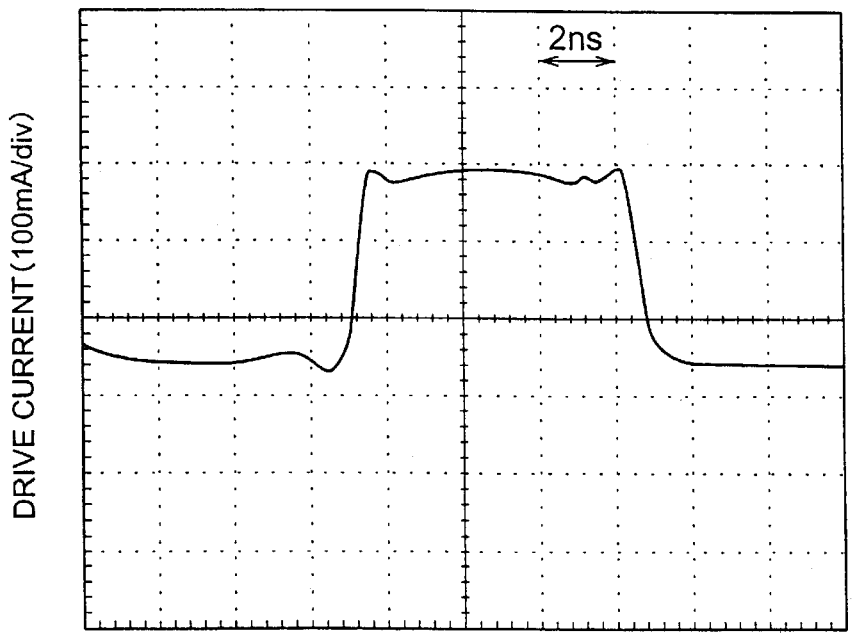
FIG. 3B is a graph (actually measured values) showing time dependence of drive current in the drive circuit for the light emitting device according to the embodiment.
Figure 3C:
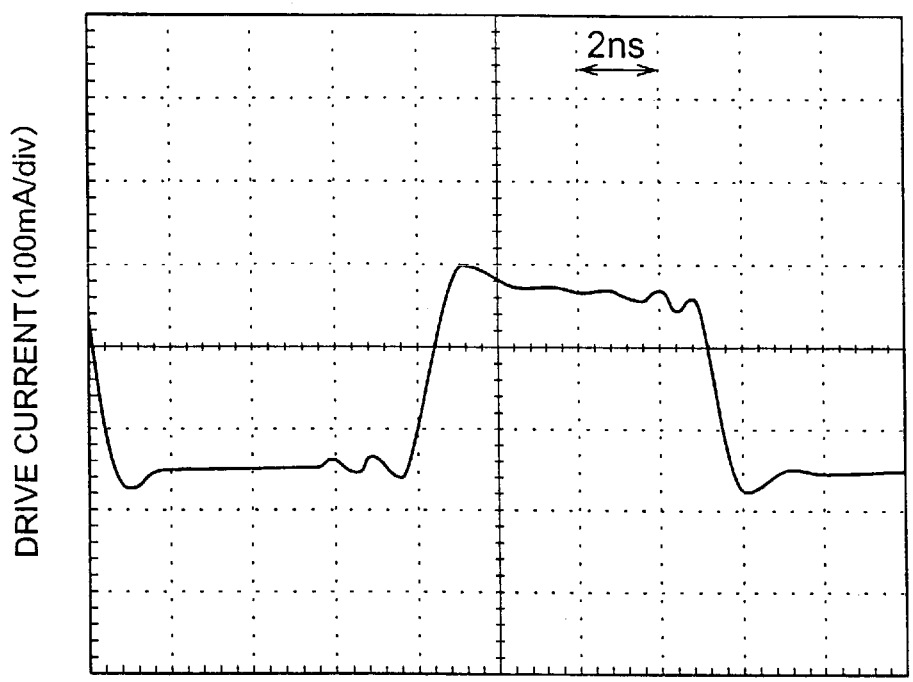
FIG. 3C is a graph (actually measured values) showing time dependence of drive current in a drive circuit for a light emitting device according to a comparative example.
Figure 4:
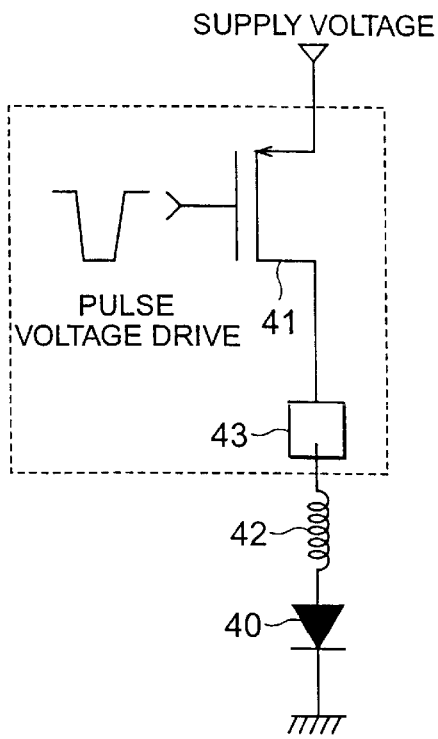
FIG. 4 is a diagram showing a configuration of a conventional drive circuit for a light emitting device, presented as a comparative example.
Figure 5:
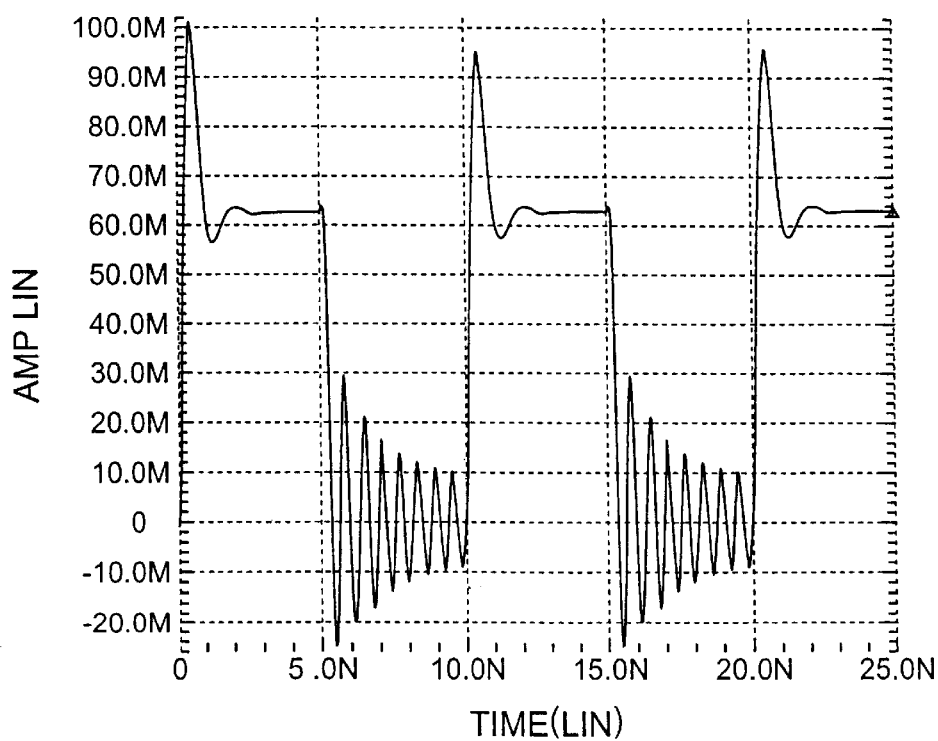
FIG. 5 is a diagram showing the simulation result of the conventional drive circuit for the light emitting device.
Figure 6:
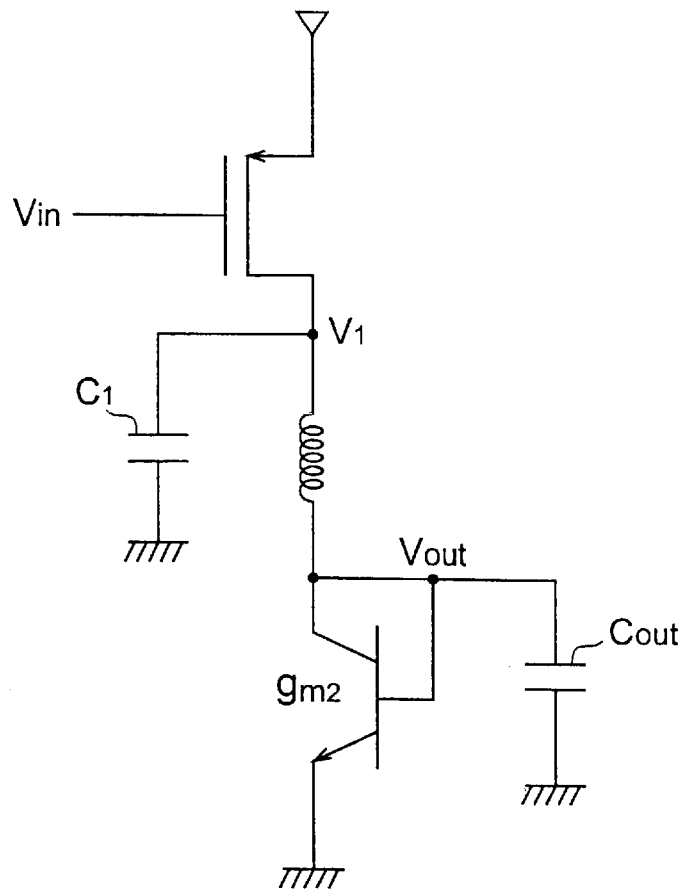
FIG. 6 is a diagram showing an example of the drive circuit for the laser diode by means of a PMOS-FET.
Figure 7:
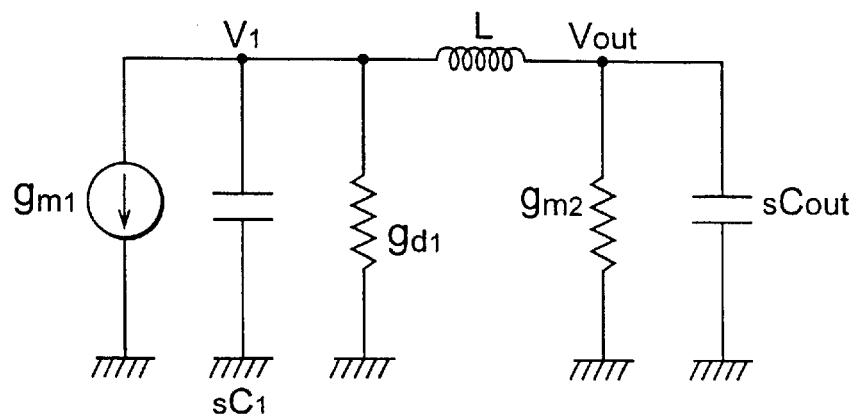
FIG. 7 is a diagram showing an equivalent circuit of FIG. 6.
Figure 8:
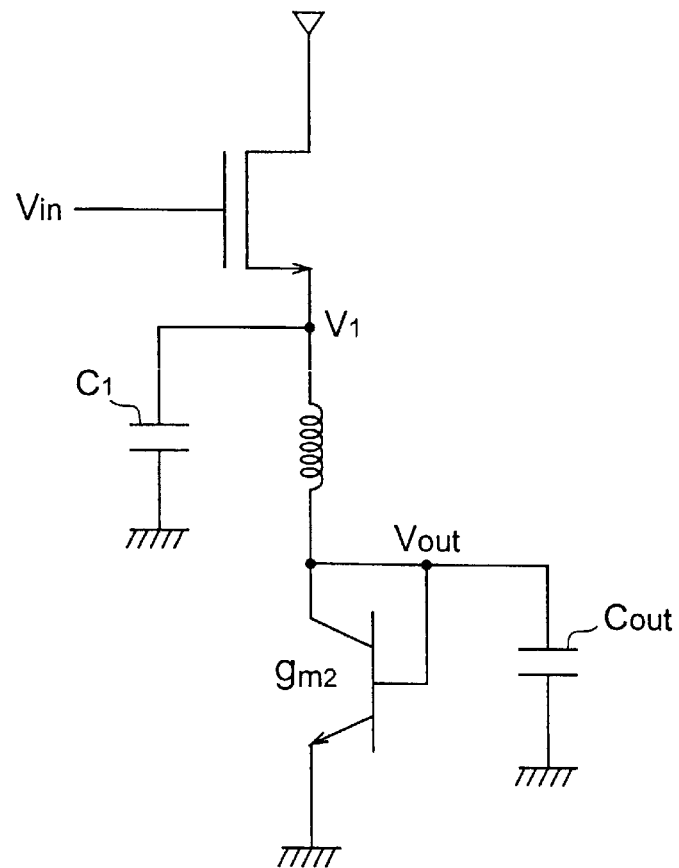
FIG. 8 is a diagram showing an example of the drive circuit for the laser diode by means of a simple source follower circuit.
Figure 9:
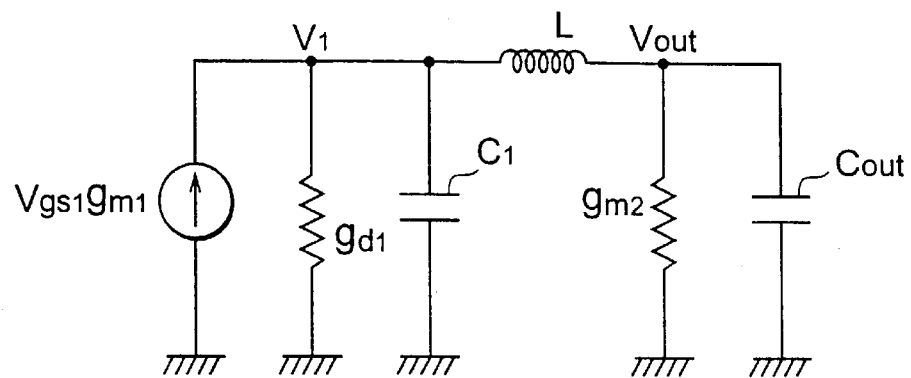
FIG. 9 is a diagram showing an equivalent circuit of FIG. 8.

FIG. 3A is a graph (simulation) showing the time dependence of the drive current in the drive circuit for the light emitting device according to the embodiment. FIG. 3B is a graph (actually measured values) showing the time dependence of the drive current in the drive circuit for the light emitting device according to the embodiment, in which the pulse width of the drive current is 9.76 ns. FIG. 3C is a graph (actually measured values) showing the time dependence of the drive current in the drive circuit for the light emitting device as a comparative example shown in FIG. 4.

As apparent from FIGS. 3A, 3B, and 3C, the ringing and peaking as seen in the comparative example appears little in the drive circuit for the light emitting device according to the embodiment. This verifies that the drive circuit can adequately drive the laser diode 1.

In the drive circuit for the light emitting device according to the present embodiment, as described above, since the resonance constant Q can be made small by using the feedback loop for the source follower circuit consisting of the NMOS-FET, it becomes feasible to suppress the ringing and peaking and implement the stable driving of the laser diode 1. Since the number of components can be decreased, it is feasible to reduce the influence of yield dispersion and decrease the cost. Since the impedance can be controlled at a low level, the gate voltage can be set low, thus enabling the driving at the low supply voltage. Further, since there arises no problem even with some parasitic capacitance, there is no need for employing the configuration of lowering the parasitic capacitance as before.

As described above, the drive circuit for the light emitting device according to the present invention is constructed in the structure provided with the source follower circuit consisting of the NMOS-FET connected to the anode side of the light emitting device and adapted to directly drive the light emitting device, the source follower circuit consisting of the PMOS-FET the gate terminal of which is connected to the source terminal of the source follower circuit consisting of the NMOS-FET, and the PMOS-FET adapted to supply the electric current to the source follower circuit consisting of the PMOS-FET.

This configuration makes the resonance constant Q small and thus makes it feasible to suppress the ringing and peaking and implement the stable driving of the light emitting device. Since the number of components can be decreased, it is feasible to reduce the influence of yield dispersion and decrease the cost. Since the impedance can be controlled at a low level, the gate voltage can be set low, thus enabling the driving at the low supply voltage. Further, since there arises no problem even with some parasitic capacitance, there is no need for employing the configuration of lowering the parasitic capacitance as before.

What is claimed is:

1. A drive circuit for a light-emitting device, comprising:
   an NMOS-FET (2) having a gate terminal and supplying a drive current to the light emitting device via a first node;
   a first PMOS-FET (3) having a gate terminal that is connected to said first node; and
   a second PMOS-FET (4) having a gate terminal that receives an input signal, said second PMOS-FET (4) being connected to said first PMOS-FET (3),
   wherein a second node between said first and second PMOS-FETs (3, 4) is connected to the gate terminal of said NMOS-FET (2).

2. The drive circuit according to claim 1 wherein a mutual conductance ot a source follower circuit comprising said NMOS-FET has either value in a range of 10 mS to 100 mS.

3. The drive circuit according to claim 1 comprising a PMOS-FET group for further supplying a drive current to said light emitting device through a node between said NMOS-FET and the light-emitting device.

4. A light emitting apparatus comprising said light emitting device and the drive circuit as set forth in claim 1.

* * * * *